United States Patent [19]

Muraoka et al.

[11] 4,095,095

[45] June 13, 1978

[54] APPARATUS FOR MANUFACTURING SEMICONDUCTOR DEVICES

[75] Inventors: Hisashi Muraoka, Yokohama; Teruo Yoneyama, Yokosuka, both of Japan

[73] Assignee: Tokyo Shibaura Electric Co., Ltd., Tokyo, Japan

[21] Appl. No.: 782,757

[22] Filed: Mar. 30, 1977

[30] Foreign Application Priority Data

Mar. 31, 1976 Japan .................................. 51-34414
Mar. 31, 1976 Japan .................................. 51-35661
Mar. 31, 1976 Japan .................................. 51-35662

[51] Int. Cl.² .................. G06C 15/00; G06K 7/10; G06K 19/06; B01J 17/00
[52] U.S. Cl. .................................. 235/419; 235/470; 235/487; 29/569 R
[58] Field of Search .............................. 29/569, 590; 340/146.3 F, 146.3 K; 250/569, 570, 568; 235/61.11 E, 61.11 R, 61.7 R, 61.12 N

[56] References Cited

U.S. PATENT DOCUMENTS

| | | | |
|---|---|---|---|
| 3,854,035 | 12/1974 | Tyler | 235/61.11 E |
| 3,889,355 | 6/1975 | Aronstein | 29/569 |
| 3,909,203 | 9/1975 | Young | 235/61.7 R |
| 3,999,846 | 12/1976 | Sone | 235/61.11 E |

*Primary Examiner*—Robert M. Kilgore
*Attorney, Agent, or Firm*—Finnegan, Henderson, Farabow & Garrett

[57] ABSTRACT

On the surface of a semiconductor wafer there is formed a binary-coded pattern which has high and low reflection portions and which contains an item of wafer processing information. A scanning device is provided to scan such patterns on individual wafers in order to obtain items of scanned information. Further a control device is provided to store the items of wafer processing information. Upon receipt of an item of scanning information, the control device produces a control signal which corresponds to the item of scanning information. The control signal is supplied to one of wafer processors, which effects on the semiconductor wafer the process necessary to manufacture a semiconductor device.

7 Claims, 13 Drawing Figures

F I G. 1A 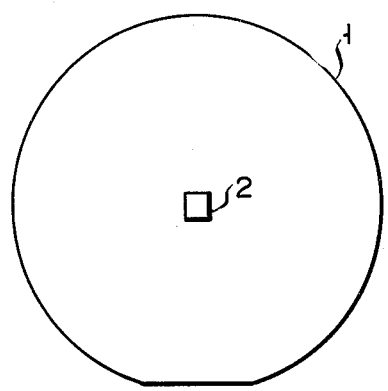 F I G. 1B 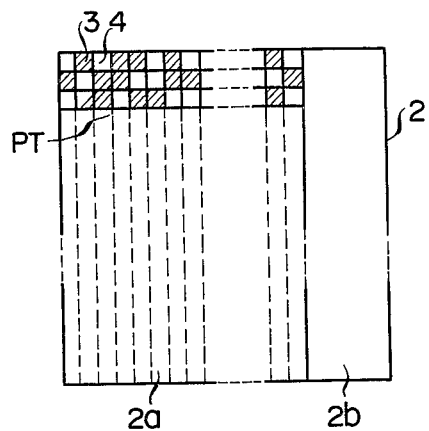
F I G. 2A 
F I G. 3A 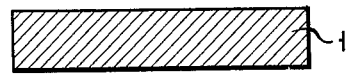
F I G. 2B 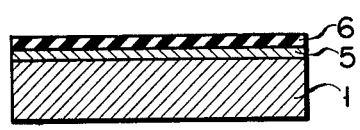
F I G. 3B 
F I G. 2C 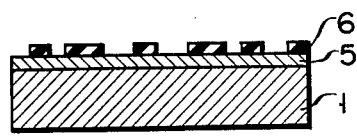
F I G. 3C 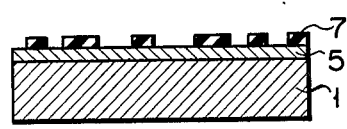
F I G. 2D 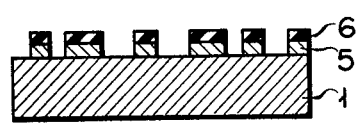
F I G. 3D 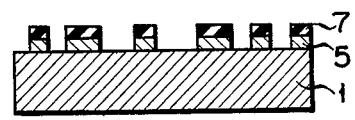

APPARATUS FOR MANUFACTURING SEMICONDUCTOR DEVICES

This invention relates to an apparatus for manufacturing semiconductor devices, particularly an apparatus which can control the menufacture of semiconductor devices by utilizing items of wafer processing information read out from patterns formed on the wafers to be used for manufacturing semiconductor devices.

It is demanded that semiconductor devices such as LSI (large scale itegrated) circuits should have a higher integration density and a higher operational characteristic. Further, it is required that more types of semiconductor devices should be manufactured. In most cases, however, semiconductor devices of each type are made in small numbers at a time. To manufacture semiconductor devices of various types having a high operational characteristic, each type in small numbers at a time, the control of the manufacture is extremely complicated.

Generally, to form active or passive elements of the same wafer by applying various manufacture processes, 20 to 50 wafers of the same type, which make one lot, are put in a carrier boat. Thus, 20 to 50 wafers are jointly put under the same manufacture control. But it is often necessary to apply special processes to fewer individual wafers. If special processes are applied under the conventional conditions to the individual wafers, respectively, the manufacture efficiency is lowered extremely. Suppose it is possible to print an identification mark on each wafer or to store in each wafer an item of processing information (e.g. process which the wafer is to undergo and conditions under which the process is to be carried out) and to read the identification mark or an item of processing information from the wafer and to process the wafer according to the mark or item of information read out from the wafer. Then the manufacture of few semiconductor devices of various types can be easily controlled.

Accordingly it is an object of this invention to provide an apparatus for manufacturing semiconductor devices, which reads an item of wafer processing information from the pattern formed on each wafer and which manufactures semiconductor devices while controlling the manufacture processes on each wafer according to the item of information read out from the pattern.

The apparatus according to this invention comprises a scanning device for scanning a binary-coded pattern formed on a selected region of a semiconductor wafer, having high reflection portions and low reflection portions and containing an item of wafer processing information based on which a semiconductor device is to be manufactured in the semiconductor wafer, thereby to obtain an item of scanned information; a control device for storing a plurality of items of wafer processing information and reading out, in response to an item of scanned information from said scanning device, an item of wafer processing information which corresponds to the item of scanned information, thereby to produce a control signal corresponding to the item of wafer processing information thus read out; and at least one wafer processor for processing, upon receipt of control signal from said control apparatus, the wafer in accordance with the item of wafer processing information which corresponds to the control signal.

According to the invention, a pattern stored with a specific item of wafer processing information is scanned, thereby to obtain an item of scanned information, based on which a specific process is applied on the wafer under specified condition, thereby to manufacture a semiconductor device. The apparatus according to this invention can therefore readily control the manufacture of semiconductor devices such as LSI circuits which are manufactured in small numbers at a time and under complicated conditions.

This invention can be more fully understood from the following detailed description when taken in conjunction with the accompanying drawings, in which:

FIG. 1A is a plan view of a silicon wafer having a portion where a pattern having high and low reflection portions is formed;

FIG. 1B is an enlarged view of the portion of the wafer of FIG. 1A where the pattern is formed;

FIGS. 2A to 2D show the steps of a method for forming the pattern having high and low reflection portions;

FIGS. 3A to 3D show the steps of another method for forming the pattern having high and low reflection portions;

Figure 4:
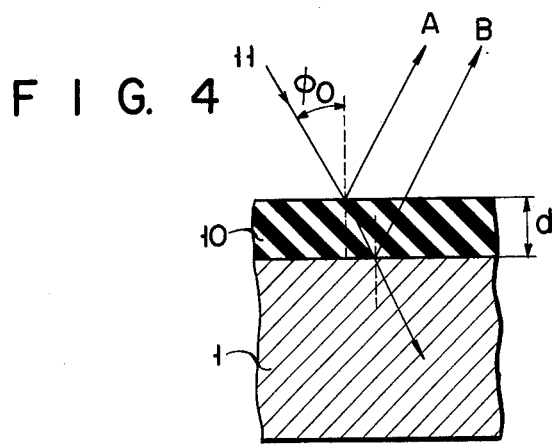
Figure 6:
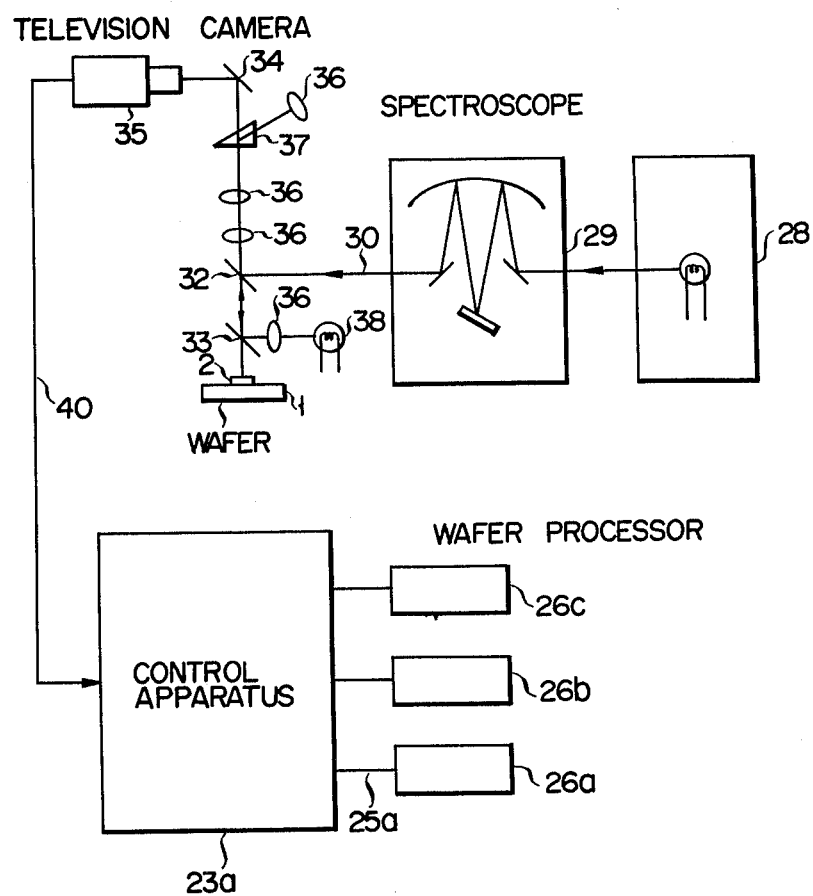
Figure 5:
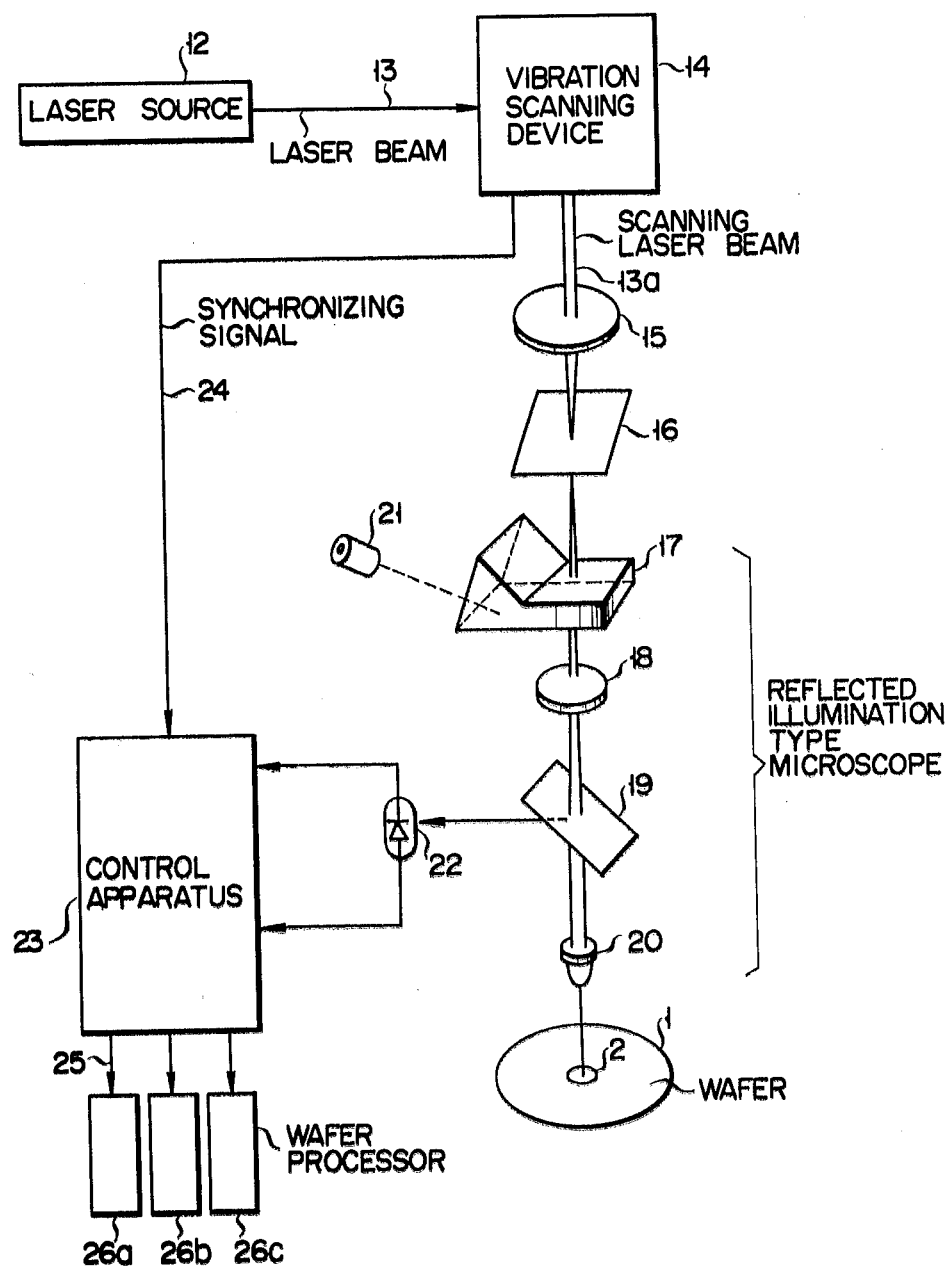

FIG. 4 explains still another method for forming the pattern having high and low reflection portions;

FIG. 5 schematically shows one embodiment of the apparatus according to this invention; and FIG. 6 schematically shows another embodiment of the apparatus according to this invention.

A silicon wafer 1 shown in FIG. 1A is subjected to processes such as oxidation, photo-etching, chemical deposition and ion injection, thereby to manufacture a semiconductor device of a desired type. A pattern region 2 of, for example, about 1 × 1 mm is provided on a selected surface portion of the silicon wafer 1. As shown in FIG. 1B, the pattern region 2 consists of, for example, two zones 2a and 2b. In the zone 2a a pattern PT is formed, while no pattern is formed in zone 2b. The pattern PT consists of a number of subregions of, for example, 8 × 8 microns which form a chessboard pattern. Of these subregions, the shaded ones 3 reflect less visible light than the other subregions 4. Thus, the pattern PT have low reflection portions and high reflection portions.

When the pattern PT is scanned by a visible light beam, the subregions 3 reflect a little light which corresponds to, for instance, a "0" bit, and the subregions 4 reflect much light which corresponds to an "1" bit. The light reflected on the subregions 3 and 4 is detected by, for example, a photosensitive diode, thereby to obtain an item of scanned information or information resulting from the scanning.

The pattern PT is so formed as to store an item of wafer processing information, i.e. a processing step to be carried out on the wafer 1 and the conditions under which the wafer 1 is to undergo the step 1. Approximately 15,000 subregions 3 and 4 can be arranged on the entire surface of the pattern region 2 if the pattern region 2 measures 1 × 1 mm.

With reference to FIGS. 2A to 2D there will be explained a method for forming the pattern PT.

FIG. 2A shows the cross section of that portion of the wafer 1 on which the pattern region 2 is formed. First, a polycrystal silicon layer 5 about 3000A is formed on the pattern region 2. The layer 5 may be epitaxially grown at about 650° C by thermally decomposing monosilane ($SiH_4$) in the conventional manner.

Then, as shown in FIG. 2B, a photoresist film 6 is formed on the polycrystal silicon layer 5. The photoresist film 6 is partially removed, as shown in FIG. 2C, as it is irradiated with an electron beam or an X-ray beam in the well-known method. The film 6 is partially removed in such a manner as to form a desired pattern. Using the partially remaining film 6 as a mask, the polycrystal silicon layer 5 is plasma-etched as shown in FIG. 2D. Thus, those portions of the pattern region 2 on which remains no polycrystal silicon layer make subregions which reflect much visible light, while the other portions on which remains the polycrystal silicon layer 5 make subregions which reflect visible light a little. In this manner a pattern PT having high and low reflection portions is formed on the pattern region 2.

Another method for forming the pattern PT will now be explained with reference to FIGS. 3A to 3D.

On the pattern region 2 of a wafer 1 a polycrystal silicon layer 5, a silicon nitride ($Si_3N_4$) layer 7 and a photoresist film 6 are formed in this order as shown in FIG. 3B. Then, the photoresist film 6 is exposed to light through a mask (not shown) and partially removed to form a pattern. Using the partially remaining film 6 as a mask, beam-blanking is applied to the silicon nitride layer 7. Thus the layer 7 is so removed partially as to form the same pattern as the photoresist film 6 did, as shown in FIG. 3C. Thereafter, using the partially remaining silicon nitride film 7 as a mask, plasma-etching is applied to the polycrystal silicon layer 5. The layer 5 is so plasma-etched in parts as to form the same pattern as the silicon nitride layer 7 did, as shown in FIG. 3D. As a result, those portions of the pattern region 2 which are exposed make subregions which reflect much visible light, while the other portions on which remains the polycrystal silicon film 5 make subregions which reflect visible light a little. The silicon nitride film 7 on the polycrystal film 5 does not affect at all the generation of an item of scanned information when the pattern PT is scanned optically. For this reason it does not matter if the film 7 is left on the polycrystal silicon layer 5.

A further method for forming the pattern PT will be explained with reference to FIG. 4.

On the pattern region 2 of a silicon wafer 1 there is formed a silicon dioxide film 10 having a thickness $d$. A laser beam 11 having a wavelength of $\lambda$ is applied to the silicon dioxide layer 10 at an incident angle of $\phi_0$. Then, a light beam A reflected on the surface of the silicon dioxide layer 10 is obtained. Concurrently another light beam B reflected on the surface of the silicon wafer 1 is obtained. The reflected beams A and B interfer with each other. Let $A_0$ and $B_0$ denote the intensity fo the reflected beam A and the intensity of the reflected beam B, respectively. Then, the intensity I of the reflected light beam resulting from the interference will be represented, as well known, by the following formula:

$$I = A_0^2 + B_0^2 + 2A_0B_0 \cdot \cos \gamma,$$

where $\gamma$ denotes the phase difference between the reflected beams A and B. The phase difference $\gamma$ may be represented by the following formula:

$$\gamma = (2\pi/\lambda) \cdot 2d \sqrt{n_1^2 - n_0^2 \cdot \sin^2 \phi_0}.$$

Here, $n_1$ and $n_0$ denote the refractive index of silicon dioxide and the refractive index of air, respectively. In the scanning optical system of FIG. 5, which will be described later, the incident angle $\phi_0$ is almost nil. It follows that the intensity I of the reflected light beam becomes minimal when the phase difference $\gamma$ satisfies the following formula:

$$\gamma = (2P + 1)\pi, \text{ where } P = 0, \pm 1, \pm 2, \ldots$$

That is, if the wavelength of the laser beam 11 is 1091A, the intensity I of the resultant reflected light beam becomes minimal when the thickness of the silicon dioxide layer 10 is an odd-number multiple of 1091A.

Accordingly, if a silicon dioxide layer is formed on the pattern region 2 to have such a thickness as makes the intensity I of the resultant reflected light beam become minimal, a desired pattern PT can be formed merely by removing, in the conventional etching manner, only those portions of the siliccon dioxide layer which correspond to subregions 4 shown in FIG. 1B.

With reference to FIG. 5 there will now be described a device which optically scans the pattern PT and obtains a scanned signal therefrom. The device is provided with a helium-neon laser source 12 the output of which is 4 to 5mW. The laser source 12 emits a laser beam 13 having a wavelength of 6328A. The laser beam 13 is directed to a vibration scanning device 14. In the vibration scanning device 14 the laser beam 13 is deflected by two rotary, multi-faced mirrors (not shown) and changed into a scanning laser beam 13a to scan the pattern region 2 on the wafer 1 both in X direction and in Y direction. The scanning laser beam 13a is focussed through a relay lens 15 into a spot light on an image plate 16. The spot light scans a square area of 19 × 19 mm on the image plate 16.

A prism 17, deflection plate 18, a semi-transparent mirror 19, an objective lens 20 and an ocular 21 constitute a microscope of vertical reflected illumination type. The laser beam 13a focussed into a spot light on the image plate 16 is further focussed within the microscope into a spot light having a diameter of, for example, 2 microns. The focussed laser beam scans the pattern PT in the pattern region 2 of the wafer 1 which is placed right under the objective lens 20. Through the ocular 21 it is assured whether the laser beam 13a scans the pattern PT without fail.

During the laser beam scanning on the pattern PT, the light reflected from the pattern PT passes through the objective lens 20 and reaches the semi-transparent mirror 19. On the mirror 19 the light is reflected so as to be directed to a photosensitive diode 22. This reflected light contains an item of binary-coded information consisting of "0" and "1" codes which correspond to the subregions 3 and subregions 4 of the pattern PT shown in FIG. 1B. The item of binary-coded information is converted by the photosensitive diode 22 into an item of electric scanned information. The item of scanned information is fed into a control apparatus 23. In the control apparatus 23 the item of scanned information from the photosensitive diode 22 is converted into a code signal consisting of "0" and "1" binary codes. This information-into-signal conversion is effected by a scanning synchronization signal 24 supplied to the apparatus 23 from the vibration scanning device 14.

The control apparatus 23 comprises an electronic computer (not shown). Stored in the memory device of the computer are a plurality of items of wafer processing information based on which various processes are to be applied to each wafer 1. Each time a code signal is produced, the control apparatus 23 reads out from the memory device data 25 representing the item of wafer processing information which corresponds to the code signal. The data 25 is supplied to a selected one of wafer processors 26a, 26b, 26c . . . . According to the data 25 the selected processor applied to the wafer 1 the process which is defined by the pattern PT formed on the wafer 1.

Namely, according to this invention, the process to be applied to each wafer and the conditions under which the process is to be applied are stored in the wafer itself, and a plurality of items of wafer processing information based on which various processes are to be applied to each wafer. An item of wafer processing information which corresponds to an item of electric scanning information obtained from a wafer is supplied from the control apparatus to a selected one of wafer processors. According to the item of wafer processing information the selected wafer processor automatically applies to the wafer the process defined by the item of electric scanning information.

The pattern PT having low and high reflection portions may be scanned by a television camera as shown in FIG. 6. Light from a light source 28 is passed through a spectroscope 29, thus obtaining a visible, monochromatic light beam 30. The visible light beam 30 is passed through semi-transparent mirrors 32 and 33, thereby to irradiate a pattern PT formed on a wafer 1. The light reflected from the pattern PT, i.e. visible image of the pattern PT, is reflected on a reflection mirror 34 and directed to the television camera 35.

A lens 36, a prism 37 and a lamp 38 for providing light for observation constitute an optical microscope, jointly with the reflection mirror 34 and the semi-transparent mirrors 32 and 33.

An output signal 40 of the television camera 35 is supplied to a control apparatus 23a. Like the control apparatus 23 shown in FIG. 5, the control apparatus 23a comprises an electronic computer (not shown). Stored in the memory device of the electronic computer are a plurality of items of wafer processing information based on which various processes are to be applied to the wafer 1. In the control apparatus 23a the item of electric scanned information contained in the signal 40 is converted into a code signal. In response to the code signal the control apparatus 23a reads out from the memory device data 25a representing the item of wafer processing information which corresponds to the item of electric scanned information. The data 25a is supplied to a selected one of wafer processors 26a, 26b, 26c, . . . . Then, according to the data 25a the selected processor applies to the wafer 1 the process defined by the pattern PT formed on the wafer 1.

In the zone 2a or both zones 2a and 2b of pattern region a wafer mark for identifying a wafer 1 may be stored together with the conditions under which a specific process is to be applied to the wafer 1. On the other hand, items of wafer processing information, each representing the conditions under which a specific process is carried out on a specific wafer, are stored in the memory device of the electronic computer in the control apparatus 23. In this case, an item of scanned information obtained by scanning the pattern PT contains a wafer mark and an item of wafer processing information. The item of scanned information can therefore serve to selectively read from the memory device the item of wafer processing information which shows the conditions for processing wafer identified by the wafer mark. Consequently, only if patterns PT are formed on individual wafers 1, it is possible to control successfully the manufacture of semiconductor devices, particularly when semiconductor devices of various types are fabricated, each type in small numbers.

Instead, a first pattern may be formed in the zone 2a of such pattern region 2 as shown in FIG. 1B. In the first pattern there is stored in item of wafer processing information. Upon completion of first process on the wafer 1 according to the item of wafer processing information, a second pattern is formed in the zone 2b in addition to the first pattern. The first and second patterns are combined into a composite pattern. The composite pattern may serve to store another item of wafer processing information based on which a second process is to be carried out on the wafer 1. In this case, the item of wafer processing information corresponding to the composite pattern is already stored in the memory device on the electronic computer in the control apparatus 23.

Further, a third pattern may be formed in the zone 2b of the pattern region 2 upon completion of the second process on the wafer 1 according to the composite pattern. Thus, the first, second and third patterns are combined into a second composite pattern. The second composite pattern may store still another item of wafer processing information based on which a third process is to be carried out on the wafer 1. Similar operation may be repeated, so that according to the items of scanned information obtained from the patterns successively formed in the pattern region 2, there are successively effected on the wafer 1 various processes such as oxidation, chemical deposition, ion injection, photoetching — all necessary for manufacture of semiconductor devices. The conditions of each process, e.g. oxidation temperature, are contained in the pattern.

So long as the items of wafer processing information are kept stored in the patterns formed on each wafer, it can be recognized, whenever desired, what processes the wafer has undergone, merely by reading the items of wafer processing information from the patterns.

What we claim is:

1. An apparatus for manufacturing semiconductor devices, comprising:
   a scanning device for scanning a binary-coded pattern formed on a selected region of a semiconductor wafer, having high and low reflection portions and containing an item of wafer processing information based on which a semiconductor device is to be manufactured in the semiconductor wafer, thereby to obtain an item of scanned information;
   a control apparatus for storing a plurality of items of wafer processing information and reading out, in response to an item of scanned information from said scanning device, an item of wafer processing information which corresponds to the item of scanned information, thereby to produce a control signal corresponding to the item of wafer processing information thus read out; and
   at least one wafer processor for processing, upon receipt of the control signal from said control apparatus, the wafer in accordance with the item of wafer processing information which corresponds to the control signal.

2. The apparatus according to claim 1, wherein said scanning device uses a laser beam to scan the binary-coded pattern.

3. The apparatus according to claim 1, wherein said scanning device includes a television camera.

4. The apparatus according to claim 1, wherein said binary-coded pattern contains an identification mark for distinguishing the wafer from others.

5. The apparatus according to claim 1, wherein said binary-coded pattern is a composite pattern which consists of a first pattern storing a first item of wafer processing information and a second pattern formed in addition to the first pattern upon completion of a first wafer process corresponding to the first pattern, said composite pattern storing a second item of wafer processing information based on which a second wafer process is carried out.

6. The apparatus according to claim 1, wherein said binary-coded pattern comprises a plurality of polycrystal silicon layers arranged in a specific pattern on said selected region of the semiconductor wafer, said polycrystal silicon layers serving as said low reflection portions in respect of the illuminating light.

7. The apparatus according to claim 1, wherein said binary-coded pattern comprises a plurality of silicon dioxide layers arranged in a specific pattern on said selected region of the semiconductor wafer, said silicon dioxide layers serving as said low reflection portions in respect of the illuminating light.

* * * * *